United States Patent [19]

Sakata et al.

[11] Patent Number: 4,481,233
[45] Date of Patent: Nov. 6, 1984

[54] PROCESS FOR PRODUCING SOLID-STATE COLOR IMAGE PICKUP ARRAY

[75] Inventors: Hajime Sakata, Tokyo; Kojiro Yokono, Yokohama; Seiichi Takahashi, Kawasaki, all of Japan

[73] Assignee: Canon Kabushiki Kaisha, Tokyo, Japan

[21] Appl. No.: 466,839

[22] Filed: Feb. 16, 1983

[30] Foreign Application Priority Data

Feb. 23, 1982 [JP] Japan ................................. 57-27785

[51] Int. Cl.$^3$ .............................................. B05D 5/06
[52] U.S. Cl. ..................................... 427/68; 427/164; 427/259; 427/264
[58] Field of Search .................. 427/68, 164, 259, 264

[56]  References Cited

PUBLICATIONS

Lind, "A Method of Applying Dichroic Film Paterns to Television Pickup Tubes", 1958.

Primary Examiner—Bernard D. Pianalto
Attorney, Agent, or Firm—Fitzpatrick, Cella, Harper & Scinto

[57]  ABSTRACT

A process for producing a solid-state color pickup array, which comprises forming a resist mask on a wafer having a solid image pickup array; vapor-depositing a colorant on the wafer having the resist mask and on the resist mask; and removing the resist mask by dissolution, thereby eliminating selectively the colorant film vapor-deposited on the resist mask.

4 Claims, 6 Drawing Figures

PROCESS FOR PRODUCING SOLID-STATE COLOR IMAGE PICKUP ARRAY

CROSS REFERENCE TO RELATED APPLICATION

This application is related to copending application Ser. No. 468,122, filed Feb. 22, 1983, by the same entity.

BACKGROUND OF THE INVENTION

1. Field of the Invention

The present invention relates to a process for producing solid-state color image pickup array (hereinafter, shortened as solid-state color pickup array) having excellent performance characteristics.

2. Description of the Prior Art

For the production of solid-state image pickup element array provided with color-separating filters, viz. solid-state color pickup array, there has so far been known a process for the direct formation of color filters on a wafer having solid-state image pickup array. This direct formation process, known as a high precision and good yield method, includes a process utilizing vapor-deposited films of colorants such as dyes or pigments.

This process comprises repeating the following steps as many times as the number of colors necessary for the objective color filters: (1) formation of a film of colorant by vapor deposition on a wafer, (2) formation of a resist mask on the film, (3) formation of a pattern of color filters by wet etching with a selective solvent to dissolve the non-masked portion of the colorant film or by dry etching with a gas plasma or ions to ash the non-masked portion of the colorant film, and (4) formation of an intermediate transparent protective coating (the intermediate protective coating serves to protect the wafer and the already formed color filters from the etching in the next cycle).

The wet etching involves difficulties in selecting a solvent that dissolves the colorant alone without affecting the resist mask and in forming a fine structure for a color filter because the colorant film lying under the resist mask can hardly be protected from the attack of the solvent capable of dissolving the colorant.

None of these difficulties are found in the dry etching, which has, however, the following drawbacks.

The resist mask needs to be considerably thick because it also is removed during the etching of the non-masked portion of the colorant film, and the precision of the pattern is therefore lowered. In addition, the intermediate transparent protective coating is necessary for every color of the color filters in order to protect the wafer and the formed color filter elements from the dry etching. These protective coatings and the resist masks remain in the resulting filter, therefore they significantly decrease the transmittance of a formed color filter and increase the proportion of flare light. Furthermore, the whole color filter is inferior in heat resistance because of low heat resistances of the intermediate protective coatings and resist masks, although the colorant films themselves, being vapor-deposited, are excellent in heat resistance.

SUMMARY OF THE INVENTION

The primary object of this invention is to provide a process for producing a solid-state color pickup array free from the foregoing drawbacks, that is, to provide a process for producing solid-state color pickup element array, which utilizes vapor-deposition films of colorants but no etching of the vapor-deposition film.

Another object of this invention is to provide a process for producing solid-state color pickup array which is provided with vapor-deposition films of colorant alone on a wafer, said process utilizing vapor-deposition films of colorants but no intermediate protecting coating.

A further object of this invention is to provide a process for producing a solid-state color pickup array having color filters in which the local variation of spectral characteristics is minimized.

A still another object of this invention is to provide a process for preparing a solid-state color array excellent in heat resistance.

According to the present invention, there is provided a process for producing a solid-state color pickup element array, which comprises forming a resist mask on a wafer having a solid-state image pickup array; vapor-depositing a colorant on the wafer having the resist mask and on the resist mask; and removing the resist mask by dissolution, thereby eliminating selectively the colorant film vapor-deposited on the resist mask.

BRIEF DESCRIPTION OF THE DRAWINGS

FIG. 1 illustrates the step of forming a resist film on a wafer; FIG. 2 the step of forming a mask from the resist film; FIG. 3 the step of forming vapor-deposition films of a colorant; and FIG. 4 the step of forming color filter elements.

DETAILED DESCRIPTION OF THE PREFERRED EMBODIMENTS

The solid-state image pickup arrays previously formed on a wafer in this invention, include charge coupled devices (CCD), bucket brigade devices (BBD), charge injection devices (CID), and the like.

The process for producing the solid-state color image pickup array of this invention can be operated directly after the wafer has been provided with the function of image pickup elements through steps such as oxidation, etching, deposition, and diffusion steps. Thus, the process for preparing the wafer provided with a solid-state image pickup array and the process for making color filters on the wafer can be operated continuously in a production line. Therefore, the process according to the present invention do not include steps which would reduce the yield or production of a solid-state color pickup array, in which a color filter is on a wafer.

Referring now to FIGS. 1–4, preferred embodiments of this invention are illustrated.

Figure 1:
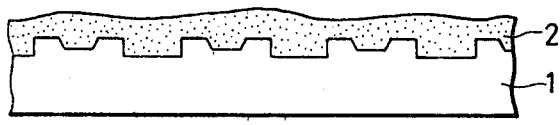
FIGS. 1, 2, 3, and 4 show the process for producing a solid-state color pickup array according to this invention.
Figure 2:
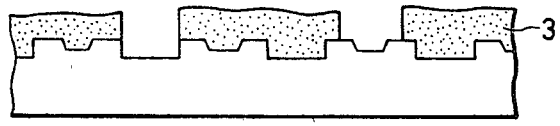
Figure 3:
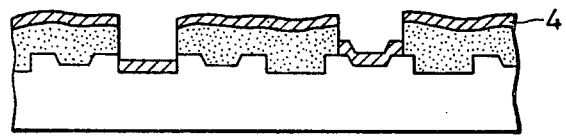

As shown in FIG. 1, a resist composition is first applied by use of a coating apparatus such as a spinner to coat a wafer having solid-state image pickup array thereupon. After pre-baking the coated resist, the resist coating 2 is exposed to light by use of a mask having an arbitrary pattern such as a striped or mosaic pattern, to form a resist mask 3 as shown in FIG. 2. As mentioned above, a resist mask is formed by using a resist.

The resists used for this purpose include those of positive type and negative type. The positive type of resist becomes soluble on exposure, so that its mask is formed by dissolving its exposed portion to be removed. The negative type of resist becomes insoluble on exposure, hence its mask is obtainable by dissolving its unexposed portion to be removed. The positive type of resist is preferable in this invention since its exposed portions (resist mask) are generally more easily removed by dissolution than in the case of negative type resist and, in addition, the resist mask of the positive type resist can be dissolved and removed more easily by exposing the whole surface of the wafer and the resist mask formed thereupon.

Figure 4:
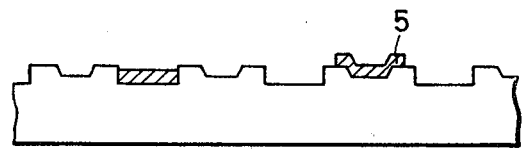

Thereafter, one or more layers 4 of colorants having desired spectral characteristics are formed by vapor deposition on the whole surface. The thickness of the vapor-deposition films 4 of the colorant is desirably 1000-10,000 Å, preferably and is 1000-5000 Å. Then, the colorant film on the resist mask is selectively removed by dissolving and removing the resist mask, thus forming desired color filter elements 5 of a desired vapor-deposited colorant, as shown in FIG. 4. As mentioned above, the resist mask under the vapor deposited film is removed.

Color filter elements of vapor-deposited colorants alone can be formed on the wafer by repeating the above steps as many times as the intended number of colors. After repetition of all the above steps, a top transparent coating may be formed, if necessary, for the purpose of protecting both the color filters and the wafer. This can be performed in a coating way such as spinner coating or vapor deposition by applying polyurethane resins, polycarbonate resins, silicone resins, poly(p-xylene) resin, $Si_3N_4$, $SiO_2$, $Al_2O_3$, $Ta_2O_5$, or the like. Thereby, the solid-state color pickup array can be made more durable.

Colorants used in this invention include dyes and pigments sublimable or vaporizable and insoluble in the solvent used for dissolving the resist mask. Some examples of the commercial dyes and pigments meeting these requirements are given below.

Blue colorants:
    Lionogen Blue R (mfd. by Toyo Ink Mfg. Co., Ltd.; C.I. No. 69800)
    Ni-phthalocyanine Yellow colorants:
    Lionogen Yellow RX (mfd. by Toyo Ink Mfg. Co., Ltd.)
    Sico Yellow D 1250 (mfd. by BASF; C.I. No. 11680)
    Sico Yellow L 0950 (mfd. by BASF; C.I. No. 11710)
    Permanent Yellow G (mfd. by FH; C.I. No. 21095)

Red colorants:
    Lionogen Magenta R (mfd. by Toyo Ink Mfg. Co., Ltd.)
    Fast Red No. 6 New (mfd. by Toyo Ink Mfg. Co., Ltd.; C.I. No. 12355)
    Sico Fast Red L 3855 (mfd. by BASF; C.I. No. 12370)
    Dainichi Fast Scarlet G (mfd. by Dainichiseika Colour & Chemicals mfg. Co., Ltd.; C.I. No. 12315)
    Sico Red L 3750 (mfd. by BASF; C.I. No. 12120)

For the resist mask, various commercial resists may be suitable. Typical resists commercially available are as follows:

Photo resists
    "OFPR" series (Nos. 2, 77, 78, and 800) (P), OMR series (Nos. 81, 83, 85, and 87) (N), TPR (N), SVR (N), OSR (N), and TPS (N) (mfd. by Tokyo Oka Co., Ltd.)
    KMPR-809 (P), KMR-747 (N), KMR-752 (N), KTFR (N), KPR (N), KPR-3 (N), and KPR-4 (N) (mfd. by Eastman Kodak Co.)
    JSR-CBR (N), JSR-CBR-901 (N), and JSR-CIR-701 (N) (mfd. by Japan Synthetic Rubber Co., Ltd.)
    Waycoat LSI Resist (P), HPR Positive Resist (Nos. 104 and 106) (P), Waycoat (HNR, HNR-999, Negative HR, IC, Type 31C, and SC) (N) mfd. by Hunt Co.)

Resists for deep ultraviolet
    ODUR series (Nos. 1000, 1001, 1010, 1013, 1014, 110 WR, and 120) (P) (mfd. by Tokyo Oka Co., Ltd.)
    AZ 2400-DUV (P) (mfd. by Shipley Co.)
    HPR (Nos. 204 and 206) (P) (mfd. by Hunt Co.)

Resists for electron beam
    OEBR (Nos. 1000, 1010, 1030, and 100) (P) (mfd. by Tokyo Oka Co., Ltd.)
    SEL (N, Type A, and Type F) (N) (mfd. by Somar Co.)
    FMR (E 101 and E 102) (P) (mfd. by Fuji Yakuhin Co., Ltd.)
    EBR (Nos. 1 and 9) (P) (mfd. by Toray Industries Inc.)

In the above description, (P) represents a positive type of resist, and (N) represents a negative type of resist.

According to the process of this invention, etching of colorant films is unnecessary during the patterning of the colorant films, so that there is no possibility that the wafer and the already formed color filter elements are attacked in the patterning steps and hence no intermediate protective coating is necessary. Consequently, there occurs no such light absorption or reflection as is caused by an intermediate protective coating or a resist mask in the prior art devices. Therefore, the transmittance can not be reduced by them. In addition, the absence of an intermediate protective coating and of a resist mask, both being inferior in heat resistance, enable the present array to be highly heat-resistant. Furthermore, since the colorant films in this invention are formed by vapor deposition, the colorant films are formed in parallel with a surface of a wafer even when the wafer surface is uneven. Therefore, no significant local variation is observed in spectral characteristics of the color filter elements thus prepared.

This invention is illustrated in more detail referring to the following Example:

EXAMPLE 1

A wafer provided with 10 solid-state image pickup array was coated by the spinner coating with a positive type of resist (trade name: ODUR 1013; mfd. by Tokyo Oka Co., Ltd.) to a thickness of 5000–7000 Å.

After being pre-baked at 120° C. for 20 minutes, the coated wafer was subjected to the mask-exposure to deep ultraviolet rays, and immersed for 3 minutes in a developer for ODUR 1000–1014 sole use and then for 2 minutes in a rinse for the same use to form a resist mask.

The whole surface of the wafer overlaid with the resist mask was exposed to deep ultraviolet rays to be made soluble in the developer.

The resulting wafer and a molybdenum boat filled with Ni-phthalocyanine were placed in a vacuum chamber. The molybdenum boat was heated to 450°–550° C. at a vacuum of $10^{-5}$–$10^{-6}$ torr to deposit Ni-phthalocyanine to a thickness of 3000 Å on the wafer and on the resist mask. Then, the resulting wafer was immersed in the developer for ODUR 1000–1014 sole use with stirring to dissolve the resist mask and at the same time to remove the colorant film lying on the mask, thereby forming blue filter elements B on the wafer.

Succeedingly, the resist ODUR 1013 was similarly applied by the spinner coating onto the wafer having the blue filter elements and a $1-\mu$ thick resist mask was formed through the pattern-exposure, development, and rinsing.

After exposure of the whole surface, Lionogen Magenta R (mfd. by Toyo Ink Mfg. Co., Ltd.) was vapor-deposited to a thickness of 3000 Å on the wafer in the vacuum chamber by heating the colorant to 400–500° C. Then, the wafer was immersed in the developer with stirring to form red filter elements R.

Further, yellow filter elements Y 4000 Å thick were formed in the same manner as the above by using Lionogen Yellow RX (mfd. by Toyo Ink Mfg. Co. Ltd.) (heating temperature at the vapor deposition: 400°–500° C.).

Figure 5:
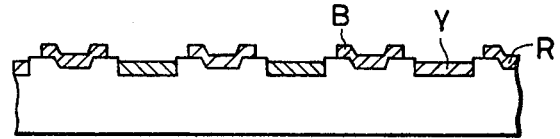
FIG. 5 shows an example of solid-state color pickup array having filters of three colors blue, red, and yellow, produced according to the process of this invention.
Figure 6:
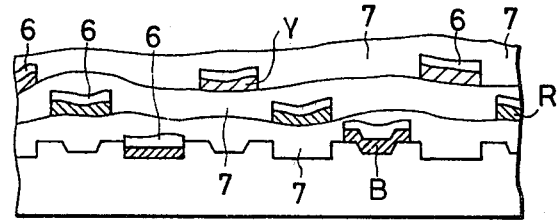
FIG. 6 shows an example of solid color pickup array having filters of the same three colors, produced according to a process of the prior art which comprises patterning vapor-deposited colorant films by dry etching.

As stated above, blue, red, and yellow color filter elements (each $10\mu \times 20\mu$) were formed on the wafer as shown in FIG. 5 by repeated patterning of the pigments of three different colors.

For the purpose of comparison with the prior art process, a solid-state color pickup element array was prepared in the following way:

After a colorant was first vapor-deposited on the same wafer as used in the above process, a resist mask 6 was formed thereupon by using a negative type of resist (trade name: ODUR 110 WR; mfd. by Tokyo Oka Co., Ltd.). Blue filter elements B were formed by dry etching with a plasma of oxygen gas, then the whole surface was coated with a $1-\mu$ intermediate protective film 7 of ODUR 110 WR by use of a spinner coater. The same steps were repeated by using the same colorants as used in the above process, forming blue, red, and yellow filter elements (B, R, and Y).

Table 1 shows the results of comparing performance characteristics between the color filter arrays prepared according to this invention to the prior art arrays.

TABLE 1

| Item | Color filter array by the prior art | Color filter array by this invention |
|---|---|---|
| Light transmittance | | |
| Red filter | 85% (λ: 660 nm) | 94% (λ: 660 nm) |
| Yellow filter | 84% (λ: 550 nm) | 91% (λ: 550 nm) |
| Blue filter | 82% (λ: 440 nm) | 89% (λ: 440 nm) |
| Variation of light transmittance from point to point in color filter elements | ±5% | ±2% |
| Heat resistance (evaluated with light transmittance after heating at 200° C. for 1 hour | Red 84% (λ: 660 nm) Yellow 82% (λ: 550 nm) Blue 75% (λ: 440 nm) Degradation was remarkable at blue spectral region. | No variation was observed in light transmittance. |
| Precision of pattern* (for the dimension of color element of $10\mu \times 20\mu$) | ±10% | ±2% |

Note*:
Percentage of deviation from proper positions of the filter elements.

As shown in Table 1, the solid-state color pickup array according to this invention, as compared with the device formed by the prior art process, is superior in light transmittance and image pickup characteristics, with color filter elements showing no local variation in thickness of colorants, intermediate protective films, and resist masks, and with the variations in thickness resulting from unevenness of the wafer surface.

No change was observed even after a heat resistance test was conducted at 200° C. for one hour.

EXAMPLE 2

A wafer provided with a solid-state image pickup array was coated by the spinner coating with a positive type of resist (trade name: ODUR 1000; mfd. by Tokyo Oka Co., Ltd.) to a thickness of 5000–7000 Å.

After being pre-baked at 85° C. for 20 minutes, the coated wafer was subjected to the mask-exposure to far ultraviolet rays, and immersed for 3 minutes in a developer for ODUR 1000 sole use and then 2 minutes in a rinse for the same use to form a resist mask.

Then, blue, red, and yellow filter elements were prepared on the resulting wafer in the same manner as used in Example 1 to prepare a color filter. The resulting color filter showed results similar to those in Example 1.

What is claimed is:

1. A process for producing a solid-state color pickup array, which comprises:
    (a) forming a resist mask on a wafer having a solid-state image pickup array wherein the portion of the wafer having the resist mask formed thereon is the unexposed portion of the wafer and the remainder of the wafer is the exposed portion;
    (b) vapor-depositing a colorant on the exposed wafer and on the resist mask on the wafer; and
    (c) removing by dissolution the resist mask thereby also eliminating the portion of the colorant film vapor-deposited on the resist mask.

2. The process according to claim 1, wherein the resist mask is formed of a positive type of resist.

3. The process according to claim 1, wherein the colorant film has a thickness of 1000–10,000 Å.

4. The process according to claim 1, further comprising forming a transparent protective coating after the step for removing the colorant film vapor-deposited on the resist mask.

* * * * *